(12) United States Patent
Ono et al.

(10) Patent No.: US 8,345,473 B2
(45) Date of Patent: Jan. 1, 2013

(54) FERROMAGNETIC THIN WIRE ELEMENT

(75) Inventors: Teruo Ono, Uji (JP); Yoshinobu Nakatani, Funabashi (JP)

(73) Assignees: Kyoto University, Kyoto (JP); University of Electro-Communications, Tokyo (JP)

( * ) Notice: Subject to any disclaimer, the term of this patent is extended or adjusted under 35 U.S.C. 154(b) by 311 days.

(21) Appl. No.: 12/672,330

(22) PCT Filed: Apr. 21, 2008

(86) PCT No.: PCT/JP2008/001040
§ 371 (c)(1),
(2), (4) Date: Feb. 5, 2010

(87) PCT Pub. No.: WO2009/130738
PCT Pub. Date: Oct. 29, 2009

(65) Prior Publication Data
US 2011/0069541 A1    Mar. 24, 2011

(51) Int. Cl.
*G11C 11/14* (2006.01)
(52) U.S. Cl. ............. 365/171; 365/81; 365/87; 365/88; 365/161; 365/109
(58) Field of Classification Search .................. 365/171, 365/121, 81, 87, 88, 161, 109, 66, 65
See application file for complete search history.

(56) References Cited

U.S. PATENT DOCUMENTS

2007/0217256 A1* 9/2007 Ono .............................. 365/171

FOREIGN PATENT DOCUMENTS

| JP | A-2007-235119 | 9/2007 |
| WO | WO 2006/090656 A1 | 8/2006 |

OTHER PUBLICATIONS

Yamaguchi et al., "Current-Driven Domain Wall Motion Due to the Spin-Transfer Effect," *Journal of Applied Magnetics Society of Japan*, vol. 28, No. 3, pp. 343-346, 2004.
Kiselev et al., "Microwave oscillations of a nanomagnet driven by a spin-polarized current," *Letters to Nature*, vol. 425, pp. 380-383, Sep. 25, 2003.
International Search Report issued in International Application No. PCT/JP2008/001040; Mailed on Jun. 24, 2008.

* cited by examiner

*Primary Examiner* — Thong Q Le
(74) *Attorney, Agent, or Firm* — Oliff & Berridge, PLC

(57) ABSTRACT

The present invention uses a ferromagnetic thin wire having a domain wall inside, with the magnetic moment at the center thereof being perpendicular to the longitudinal axis of the thin wire. With the domain wall being fixed by a domain wall fixation device (e.g. antiferromagnetic thin wires) so that the domain wall is prevented from moving in the ferromagnetic thin wire, when a direct current is supplied, the magnetic moment rotates in the immobilized domain wall. This rotation of the moment can be detected by a TMR element or the like. This configuration of the ferromagnetic thin wire element can be directly used to create a microwave oscillator or magnetic memory.

18 Claims, 5 Drawing Sheets

FERROMAGNETIC THIN WIRE ELEMENT

TECHNICAL FIELD

The present invention relates to an element utilizing the magnetic moment (magnetization) in a domain wall included in a ferromagnetic thin wire.

BACKGROUND ART

It has been known that a magnetic structure called the "domain wall" appears within a ferromagnetic thin wire having a cross section measuring a few nanometers to several tens of nanometers in diameter. It has also been known that applying a magnetic field or electric current to a ferromagnetic thin wire having domain walls causes the domain walls to move through the thin wire. Particularly, as compared to the case of controlling the position of the domain walls by applying a magnetic field, the technique of controlling the position of the domain walls by a current supply, as described in Non-Patent Document 1, is advantageous in that the structure of the element can be much simplified.

When a domain wall is moved by supplying a current to a ferromagnetic thin wire, the moving velocity of the domain wall increases in proportion to an increase in the current density. However, the moving velocity suddenly falls if the current density exceeds a certain level. FIG. 9 is a graph showing the relationship between the current density and the moving velocity of a domain wall for different cross-sectional shapes. The graph clearly shows how the moving velocity abruptly decreases. As can be understood from FIG. 9, the threshold at which the abrupt decrease in the moving velocity occurs becomes lower as the cross-sectional shape of the ferromagnetic thin wire approaches from a rectangle to a square; the threshold disappears when the cross section is a complete square.

It has also been known that, after the abrupt decrease in the moving velocity of the domain wall, the magnetic moment begins to rotate at the center of the domain wall as the domain wall moves in the axial direction of the thin wire. (This rotation constantly occurs if the cross-sectional shape is square). FIG. 10 shows how the magnetic moment rotates in a domain wall moving through a ferromagnetic thin wire. Each of the four rectangular sections enclosed by the dotted lines in FIG. 10, having an array of small arrows, represents a part of the ferromagnetic thin wire across a domain wall. The horizontal direction in the each section, indicates the axial (longitudinal) direction of the ferromagnetic thin wire, and the array of small arrows indicates the direction of the magnetic moment. As indicated by the array of small arrows, the magnetic moments in the left and right halves of the each section face each other across the center, where the boundary is the domain wall. In the upper and lower sections, the directions of the magnetic moments in the domain walls are toward the upper side and the downside, respectively. In the left and right sections, the directions of the magnetic moments of the domain walls are toward the front side and the back side of the sheet, respectively. As indicated by the large arrows, the state of the magnetic moment in the domain wall changes with time. As is evident from FIG. 10, the magnetic moment rotates in a sectional plane and around the longitudinal axis of the ferromagnetic thin wire.

Non-Patent Document 1: Akinobu Yamaguchi, et al., "Supin Toransufaa Kouka Ni Yoru Jiheki No Denryuu Kudou (Current-Driven Domain Wall Motion Due to the Spin-Transfer Effect)", *Nihon Ouyou Jikigakkai Shi* (*Journal of Applied Magnetics Society of Japan*), Vol. 28, No. 3, 2004, pp. 343-346

Non-Patent Document 2: Kiselev, S. I. et al. "*Microwave oscillations of a nanomagnet driven by a spin-polarized current*" Nature, 425, 380-383 (2003)

DISCLOSURE OF THE INVENTION

Problem to be Solved by the Invention

As explained previously, the domain wall moves through the thin wire when the magnetic moment in the domain wall is rotating. This motion of the domain wall is unfavorable for realizing an element utilizing the magnetic moment rotation since it makes the readout of the direction of the magnetic moment in the ferromagnetic thin wire difficult.

The present invention has been developed under such circumstances, and its objective is to provide an element from which the direction of the magnetic moment can be easily read out to be effectively used.

Means for Solving the Problems

To solve the aforementioned problem, the present invention provides a ferromagnetic thin wire element utilizing the direction of the magnetic moment of a domain wall within a ferromagnetic thin wire, which is characterized by including:

a) a ferromagnetic thin wire having a domain wall inside, with a magnetic moment at the center of the domain wall being perpendicular to the longitudinal axis of the ferromagnetic thin wire;

b) a current supplier for supplying a direct current to the ferromagnetic thin wire along the longitudinal axis thereof;

c) a domain wall fixation means for fixing the domain wall so as to prevent the domain wall from moving in the ferromagnetic thin wire when the direct current is supplied from the current supplier; and d) a magnetization reader for reading the direction of the magnetic moment in the domain wall.

The domain wall fixation means in the present invention may include ferromagnets provided at both ends with respect to the axial direction of the ferromagnetic thin wire, each ferromagnet having a magnetic moment directed parallel to the axial direction of the ferromagnetic thin wire and opposite to the magnetic moment of the other ferromagnet.

Alternatively, the domain wall fixation means may be antiferromagnets provided on both sides of the domain wall with respect to the axial direction of the ferromagnetic thin wire so that the magnetic moments on both sides of the domain wall are oriented in different directions from each other.

It is preferable that the magnetization reader in the ferromagnetic thin wire element of the present invention is a tunneling magneto-resistance (TMR) element including a region where the domain wall of the ferromagnetic thin wire is present.

The inventors of the present patent application have conducted detailed research on the aforementioned ferromagnetic thin wire element and developed the idea that this element can be directly used to create a microwave oscillator.

Existing microwave oscillators, which include various kinds of semiconductor elements as their components, are still large sized, poorly resistant against high temperatures or cosmic rays, and expensive. Accordingly, there have been many active efforts in the research and development of microwave oscillators. A recently proposed technique that can solve these problems is an oscillator using a nanomagnet, which is disclosed in Non-Patent Document 2.

The oscillating frequency of the oscillator disclosed in Non-Patent Document 2 is determined by the size or form of the element. Changing this frequency requires a large external magnetic field, so that the oscillating frequency is difficult to control. Another problem exists in that this oscillator has such a complex configuration that there is a limit to its miniaturization. Furthermore, the oscillator proposed in Non-Patent Document 2 is a two-terminal device and hence accompanied by some problems inherent in the two-terminal configuration, such as being difficult to control.

A microwave oscillator obtained on the basis of the ferromagnetic thin wire element according to the present invention can solve the previously described problems that the currently used microwave oscillators have.

The microwave oscillator according to the present invention is a microwave oscillator utilizing the magnetic moment of a domain wall within a ferromagnetic thin wire, which is characterized by including:

a ferromagnetic thin wire having a domain wall inside, with a magnetic moment at the center of the domain wall being perpendicular to the longitudinal axis of the thin wire;

a current supplier for supplying a direct current to the ferromagnetic thin wire along the longitudinal axis thereof;

a domain wall fixation means for fixing the domain wall so as to prevent the domain wall from moving in the ferromagnetic thin wire when the direct current is supplied from the current supplier; and a rotation detector for detecting the rotation of the magnetic moment in the domain wall.

It is preferable that the height-to-width ratio of the cross section of the ferromagnetic thin wire is 1:1.1 or less, and the width of the same cross-section is 20 nm or smaller.

It is preferable that the rotation detector in the microwave oscillator of the present invention is a tunneling magneto-resistance (TMR) element including a region where the domain wall of the ferromagnetic thin wire is present.

The present invention also provides a microwave generation method using a ferromagnetic thin wire having a domain wall inside, the magnetic moment at the center of the domain wall being perpendicular to the longitudinal axis of the thin wire. This method is characterized by the steps of: rotating the magnetic moment around the longitudinal axis in the domain wall by supplying a direct current while fixing the domain wall so as to prevent the domain wall from moving in the ferromagnetic thin wire; and obtaining microwaves due to the rotation of the magnetic moment.

It should be noted that the oscillating frequency of the microwave oscillator according to the present invention is not limited to the frequency region of microwaves.

Furthermore, the present inventors have conducted detailed research on the relationship between the shape of the thin wire used in the ferromagnetic thin wire element and the magnetic moment, and developed the idea that the present invention can also be used to obtain a magnetic memory that utilizes the direction of the magnetic moment in the domain wall.

The magnetic memory that has been created in this manner is characterized by including:

a ferromagnetic thin wire having a domain wall inside, with the magnetic moment at the center of the domain wall being stable in one of the two directions of the cross-sectional width direction;

a pulsed current supplier for inverting the direction of the magnetic moment by supplying a pulsed direct current to the ferromagnetic thin wire along the longitudinal axis thereof;

a domain wall fixation means for fixing the domain wall so as to prevent the domain wall from moving in the ferromagnetic thin wire when the pulsed direct current is supplied from the current supplier; and a magnetization direction detector for detecting the direction of the magnetic moment in the domain wall.

Effect of the Invention

The ferromagnetic thin wire element according to the present invention is provided with the domain wall fixation means for fixing a domain wall so as to prevent the domain wall from moving in the thin wire when a current is supplied. It is therefore possible to obtain a micro-sized, extremely simple element from which the direction of the magnetic moment in the domain wall can be easily read out.

The domain wall fixation means can have a simple configuration that consists of, for example, ferromagnets added to both ends of the thin wire or antiferromagnets provided on the thin wire, so that the entire element can be miniaturized.

The use of a TMR element configuration for reading the direction of the magnetic moment is suitable for both cost reduction and miniaturization since TMR elements are simple-structured elements for which a vast array of technologies and know-how have already been accumulated.

The ferromagnetic thin wire element according to the present invention also has the advantage that it can be designed to have a three-terminal structure so that its output can be easily controlled. That is, the output frequency can be controlled by regulating the current supplied to the ferromagnetic thin wire, and the output level can be controlled by regulating the voltage of the TMR element serving as the magnetization reader.

The microwave oscillator according to the present invention can achieve the following noticeable effects that could not be achieved by conventional techniques:

The oscillator needs no external magnetic field since it can be driven by simply supplying a current to the thin wire.

The oscillator can be micro-sized, with an extraordinarily low level of drive power.

The oscillation occurs over a wide frequency range that includes useful frequency bands.

The oscillation frequency can be easily controlled by varying the current density of the supplied current.

The production cost is low.

The magnetic memory according to the present invention yields many remarkable effects based on the features of the aforementioned ferromagnetic thin wire element. Examples of those effects are as follows:

Information can be written by simply supplying a pulsed current to the thin wire, without using any external magnetic field.

The memory can be micro-sized, with an extraordinarily low level of drive power.

The production cost is low.

BEST MODE FOR CARRYING OUT THE INVENTION

The following description deals with the details of the configuration of the ferromagnetic thin wire element according to the present invention with reference to the drawings, taking a microwave oscillator and a magnetic memory as preferred embodiments of the present invention. All graphs and data that are referenced in this description have been obtained by computer simulations. Those simulations all used the material constants of permalloy (saturation magnetization, 800 emu/cm$^3$; and exchange stiffness constant, 1×10$^{-6}$ erg/cm).

[Microwave Oscillator]

Figure 1:
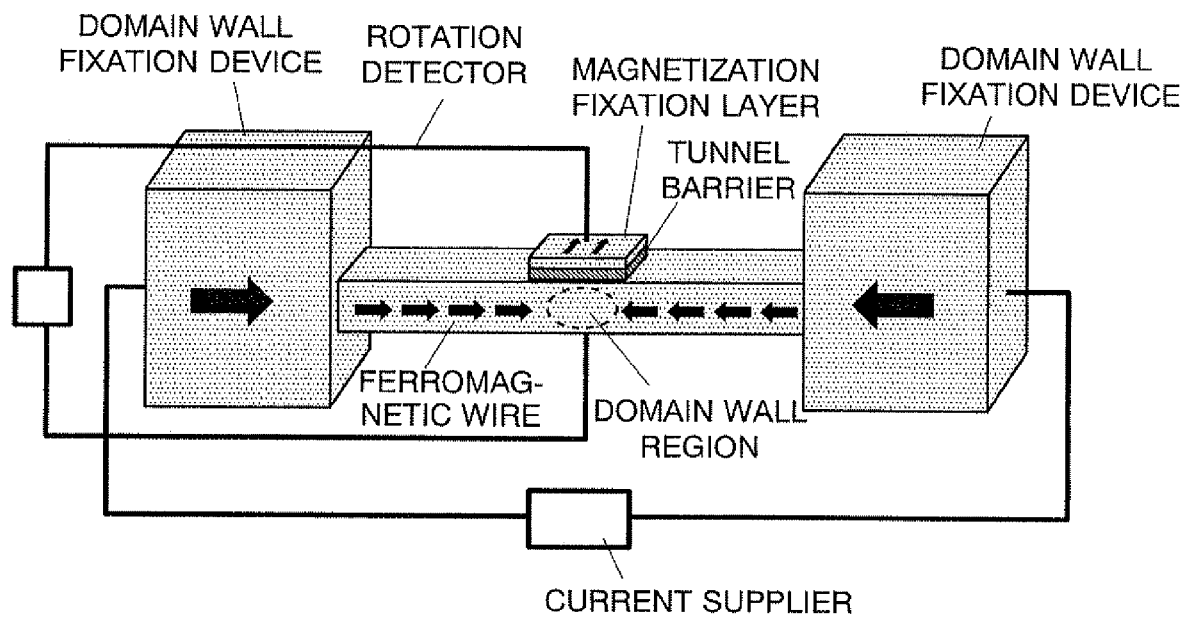
FIG. 1 is a schematic configuration diagram showing one embodiment of the microwave oscillator according to the present invention.

FIG. 1 is a schematic configuration diagram showing one mode of the microwave oscillator according to the present invention. As shown in FIG. 1, this microwave oscillator consists of a ferromagnetic thin wire, current supplier, magnetic wall fixation means and rotation detector.

(Ferromagnetic Thin Wire)

The ferromagnetic thin wire in the present invention may be made of any kind of material, regardless of whether it is a single material or alloy, as long as it is an electrically conductive ferromagnetic material. One preferred example is permalloy. Iron, cobalt, or an alloy of these elements and boron can also be preferably used.

The ferromagnetic thin wire has a domain wall inside. The magnetic moment in this domain wall needs to be directed perpendicularly to the longitudinal axis of the ferromagnetic thin wire (rather than spirally wound).

The ferromagnetic thin wire in the present invention may have any cross-sectional shape as long as the aforementioned condition is satisfied and the magnetic moment in the domain wall can be rotated by a supply of direct current.

However, it is preferable that the threshold level for the magnetic moment to begin its rotation should be low so that the magnetic moment can rotate at the smallest possible current when the direct current is supplied to the ferromagnetic thin wire. For this purpose, the height-to-width ratio of the cross section of the ferromagnetic thin wire should preferably be 1:1.1 or less. The cross section should preferably have a rectangular (square) or elliptical (circular) shape. With the cross section having any of these shapes, the structure of the domain wall will barely change regardless of what direction the magnetic moment in the domain wall points to within the thin wire's cross section. This means that the domain-wall energy barely changes (or never changes if the cross section is circular) with the rotation of the magnetic moment. Therefore, the magnetic moment in the domain wall can rotate freely.

Figure 3:
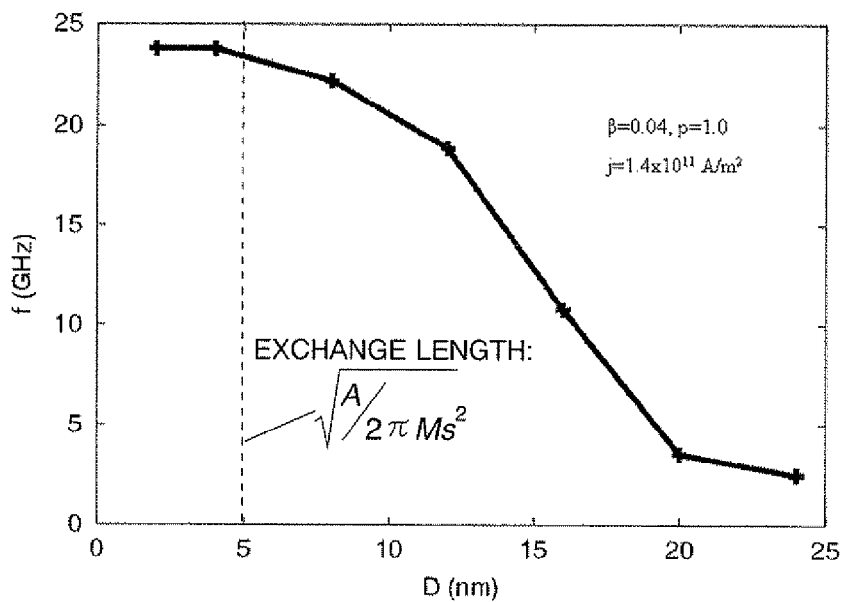
FIG. 3 is a graph showing a relationship between the rotation speed of the magnetic moment in a domain wall and the thin wire's width, with the domain wall fixed.

To increase the rotation speed of the magnetic moment, it is desirable that the ferromagnetic thin wire has a small cross-sectional width, preferably 20 nm or smaller (refer to FIG. 3).

The ferromagnetic thin wire may have any length in the axial direction as long as a domain wall can exist inside and the domain wall can be prevented from moving by the domain wall fixation means (to be described later).

FIG. 3 is a graph (simulation result) showing a relationship between the rotation speed of the magnetic moment in a domain wall and the thin wire's width, with the domain wall fixed, for a thin wire having a square cross section. The graph demonstrates that it is possible to generate oscillations at higher frequencies by decreasing the thin wire's width. The graph also shows that the rotation speed is constantly maintained at the maximum level when the thin wire's width is approximately equal to or smaller than the exchange length expressed by $(A/2\pi Ms^2)^{1/2}$, where Ms is the saturation magnetization and A is the exchange stiffness constant.

Figure 4:
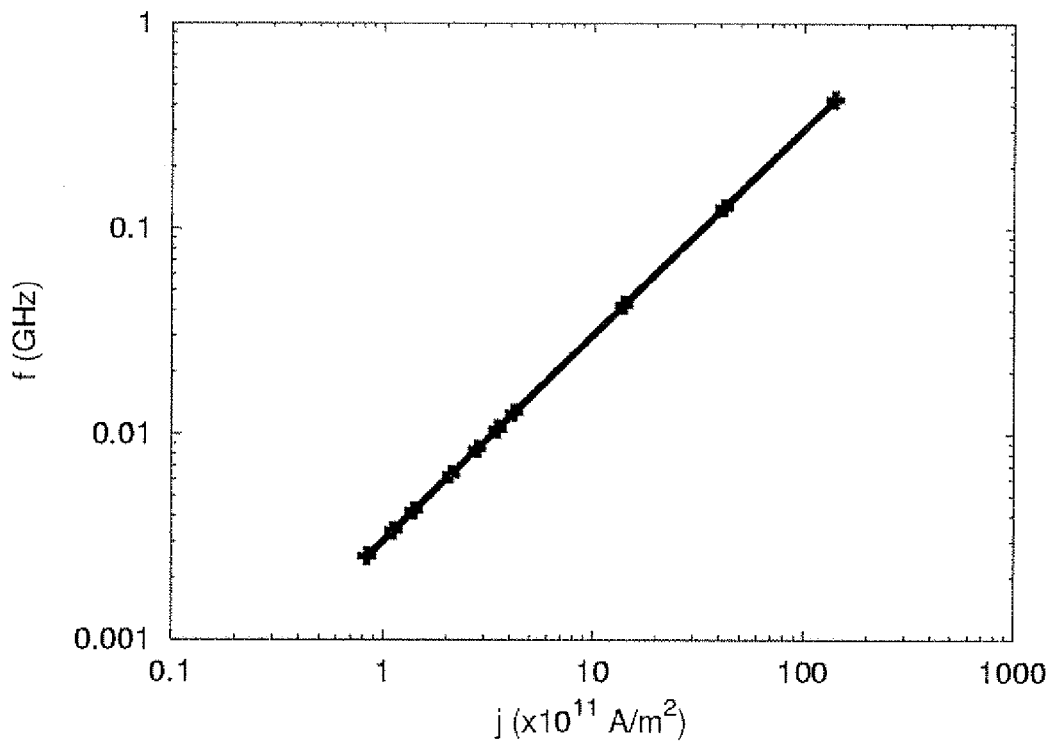
FIG. 4 is a graph showing a relationship between the density of the current supplied to the thin wire and the rotation speed of the magnetic moment in a domain wall.

FIG. 4 is a graph showing a relationship between the current density of the current supplied to the thin wire and the rotation speed of the magnetic moment for a thin wire having a square cross section measuring 4×4 nm. The domain wall is not fixed in the present case. The graph in FIG. 4 demonstrates that the rotation speed of the magnetic moment is proportional to the magnitude of the current density. Accordingly, in the microwave oscillator according to the present invention it is possible to control the oscillating frequency by varying the current density of the supplied current.

(Current Supplier)

As already explained, the means for rotating the magnetic moment in the present invention is the supply of a direct current to the ferromagnetic thin wire along the axial direction thereof. To control the rotation speed of the magnetic moment, i.e. the oscillating frequency, it is preferable to provide the function of regulating the current density of the supplied current.

(Domain Wall Fixation Means)

The domain wall fixation means is hereinafter described. The domain wall fixation means is a mechanism for preventing a domain wall from moving in the ferromagnetic thin wire when an electric current is supplied to the thin wire.

The domain wall fixation means in the present invention may be configured in any form as long as it can achieve the aforementioned objective. For example, it may preferably have the configuration shown in FIG. 1, where a ferromagnet that is larger in both cross section and volume than the ferromagnetic thin wire is provided at each end in the axial direction of the ferromagnetic thin wire. In this case, the directions of the magnetic moments of the ferromagnets at the two ends must be directed parallel to the longitudinal axis of the ferromagnetic thin wire, and the directions of the magnetic moments in these ferromagnets must be opposite to each other.

Figure 5:
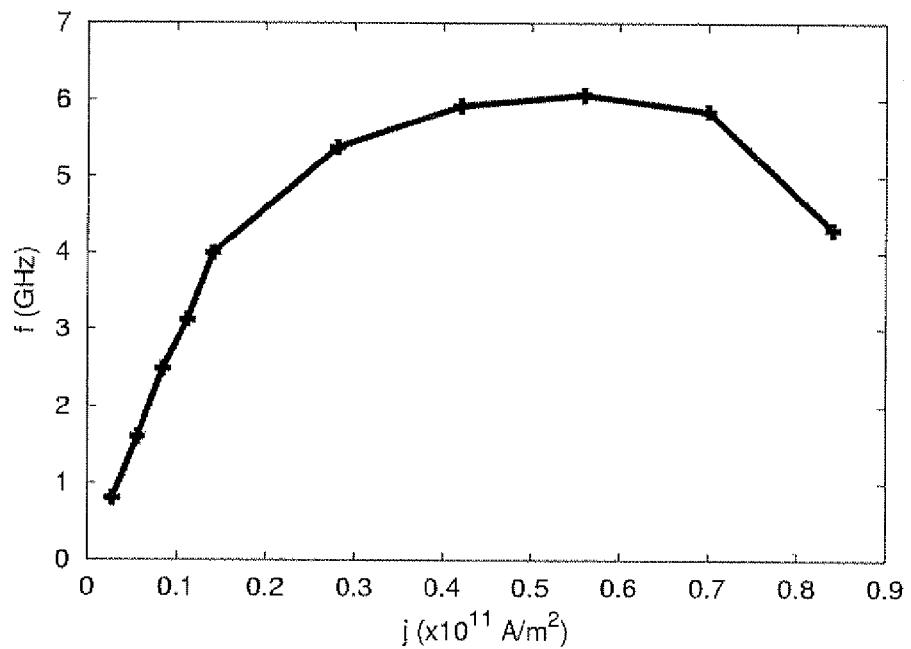
FIG. 5 is a graph showing a relationship between the density of the current supplied to the thin wire having the structure shown in FIG. 1 and the rotation speed of the magnetic moment in a domain wall.

FIG. 5 is a graph showing the relationship between the density of the current supplied in the structure shown in FIG. 1 and a change in the rotation speed of the magnetic moment in the central portion in the axial direction of the ferromagnetic thin wire (where the domain wall is located). The calculation assumed that the ferromagnetic thin wire had a length of 32 nm in the axial direction, with a square cross section of 4 nm each side. The ferromagnet at each end is a cube having the cross section measuring 8×8 nm and the length several times that of the side length of the cross section. FIG. 5 shows that the rotation of the magnetic moment was detected even after the supply of the current was initiated. Thus, it has been confirmed that the present structure is capable of fixing the domain wall inside the ferromagnetic thin wire. It has been also proven that an excessive supply of the current beyond a specific upper limit causes the domain wall to exit from the ferromagnetic thin wire. (The ferromagnetic thin wire can no longer be used as a microwave oscillator if the domain wall once exits from it.)

Figure 2:
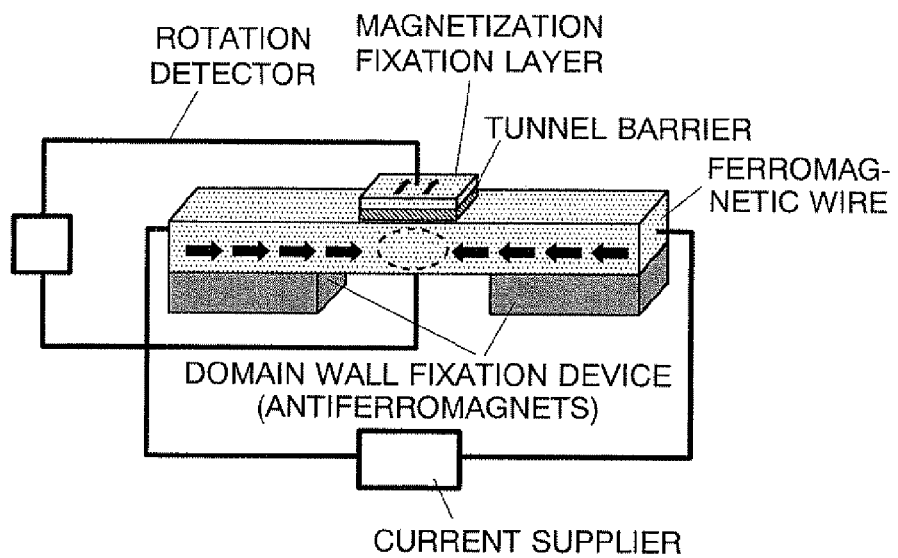
FIG. 2 is a schematic configuration diagram showing another embodiment of the microwave oscillator according to the present invention.

FIG. 2 shows another possible configuration of the domain wall fixation means, where antiferromagnets are provided on both sides of the domain wall of the ferromagnetic thin wire along the axial direction of the same thin wire, in such a manner that the magnetic moments on both sides of the domain wall are oriented in different directions from each other. In this configuration, the magnetic moments in the portion that is in contact with each antiferromagnet are oriented in the same direction due to the direct exchange coupling of the ferromagnet and antiferromagnet. In this manner, the present means can fix the magnetic moment in the ferromagnetic thin wire.

The domain wall fixation means needs only to have the function of preventing the domain wall from moving in the magnetic thin wire when a current is supplied to the thin wire. Therefore, it is possible to construct a domain wall fixation means in which either the aforementioned ferromagnet having a volume larger than that of the ferromagnetic thin wire or the aforementioned antiferromagnet is provided only on one side of the domain wall to which the domain wall will move when a current is supplied to the ferromagnetic thin wire. However, in these cases, the domain wall fixation means needs be designed so that the magnetic moment will be oriented oppositely to the moving direction of the domain wall.

Figure 6:
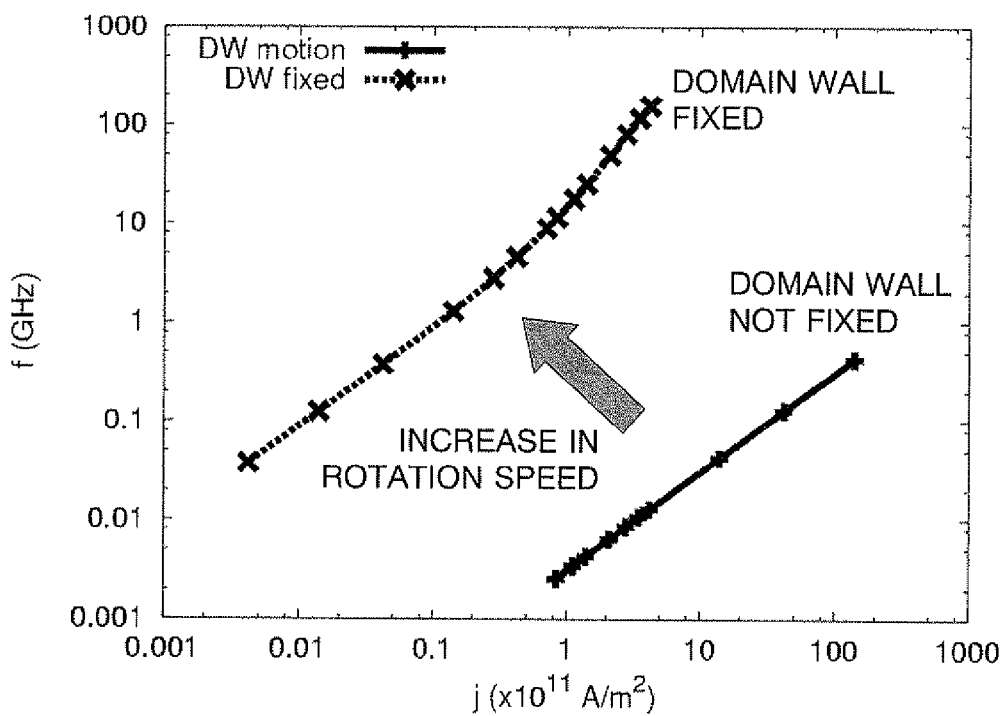
FIG. 6 is a graph showing a relationship between the density of the current supplied to the thin wire and the rotation speed of the magnetic moment in a domain wall, in the case where the domain wall is fixed and the case where the domain wall is not fixed.

By using the various previously described types of domain wall fixation means, it is possible to prevent the domain wall from moving in the ferromagnetic thin wire. This operation never impedes the rotation of the magnetic moment in the domain wall. FIG. 6 is a graph showing the relationship between the density of the current supplied to the thin wire and the rotation speed of the magnetic moment in the case where the domain wall is fixed and the case where the domain wall is not fixed. As shown in FIG. 6, preventing the domain wall from moving by the domain wall fixation means yields the effect that the rotation speed of the magnetic moment in the domain wall increases as compared to the speed attained in the case where the domain wall is not fixed.

(Rotation Detector)

Although the rotation detector for detecting the rotation of the magnetic moment in the present invention is not limited to any specific structures, it is desirable to use a TMR element structure since this structure is simple and yet capable of detecting the rotation. The basic structure of the TMR element is a layered structure consisting of a tunnel-barrier layer sandwiched between ferromagnetic metal layers. In the rotation detector of the present invention, a TMR element can be created as follows: The area of the ferromagnetic thin wire in which the domain wall exists is regarded as one ferromagnetic metal layer; a tunnel-barrier layer is formed on this area; and a magnetization fixation layer made of a ferromagnetic metal, with the direction of the magnetic moment fixed in the direction perpendicular to the axial direction of the ferromagnetic thin wire, is additionally formed on the tunnel-barrier layer. By this TMR element, the rotation of the magnetic moment in the domain wall can be easily detected. It is naturally possible to provide three layers or more.

In any of the previously described modes, the microwave oscillator can be a three-terminal structure (refer to FIGS. 1 and 2). Therefore, its output can be easily controlled. That is, the output frequency can be controlled by regulating the current supplied to the ferromagnetic thin wire, and the output level can be controlled by regulating the voltage of the TMR element serving as the magnetization reader.

[Magnetic Memory]

A magnetic memory, which is another preferable application of the ferromagnetic thin wire element according to the present invention, is hereinafter described.

The present inventors have discovered that the magnetic moment at the center of magnetization becomes stable in either one of the positive and negative directions along the cross-sectional width direction when the thin wire has a cross section whose cross-sectional width is larger than the cross-sectional height. This means that the magnetic moment in the domain wall cannot be oriented in any direction other than the aforementioned two directions if the ferromagnetic thin wire has the aforementioned structure. The present inventors have reached the idea that this feature can be utilized to create a magnetic memory having a very simple structure.

Figure 7:
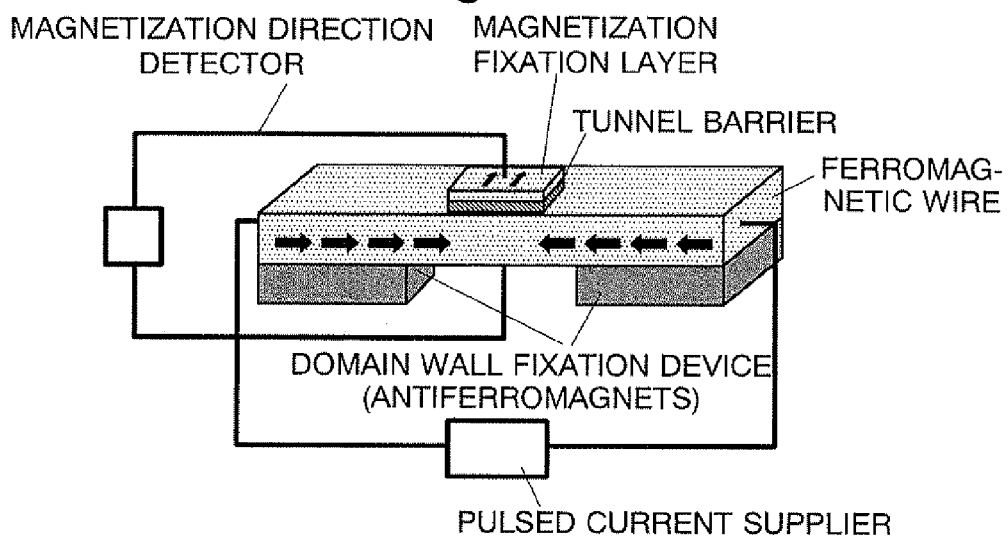
FIG. 7 is a schematic configuration diagram of one embodiment of the magnetic memory according to the present invention.

A schematic configuration of one mode of the magnetic memory according to the present invention is shown in FIG. 7. This magnetic memory has substantially the same configuration as that of the previously described microwave oscillator. However, as already mentioned, the height-to-width ratio of the cross section of the ferromagnetic thin wire in the present mode should preferably be within a range from 1:1.1 to 1:1.2. The present case also allows the cross-sectional shape to be rectangular, elliptical or any other shapes. For improving the responsiveness, it is preferable to make the cross-sectional width equal to or smaller than 20 nm. According to these designs, the direction in which the magnetic moment in the domain wall can be stabilized will be either of the two directions. By defining one direction of the magnetic moment as "0" and the other as "1", one can read the binary information. For the readout of this information, it is preferable to use a TMR element configuration as in the case of the microwave oscillator.

In the example of FIG. 7, antiferromagnets are used as the domain wall fixation means. However, this is not the only possible configuration. Any mechanisms, including the configurations applicable to the previously described microwave oscillator, may be used as long as those mechanisms can fix the domain wall so that the wall will not move in the magnetic thin wire.

(Information Writing)

Figure 8:
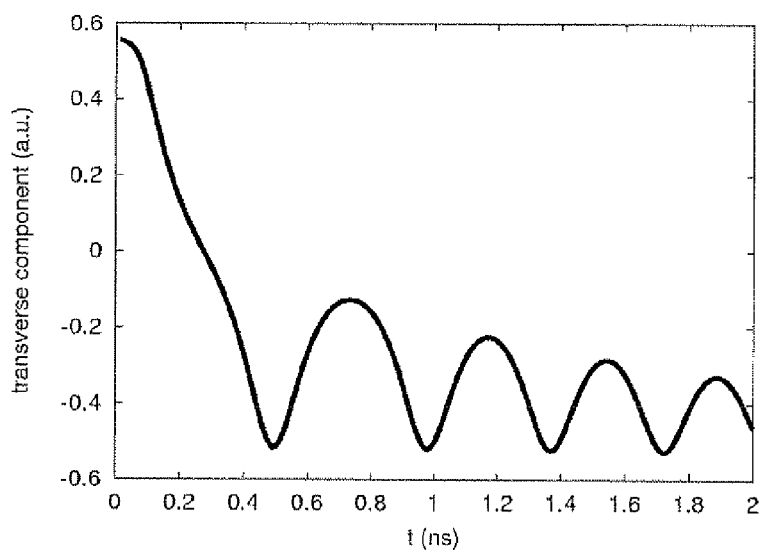
FIG. 8 is a graph showing a change in the direction of the magnetic moment in a domain wall in the case where a pulsed direct current is supplied to a ferromagnetic thin wire along the longitudinal axis thereof.
Figure 9:
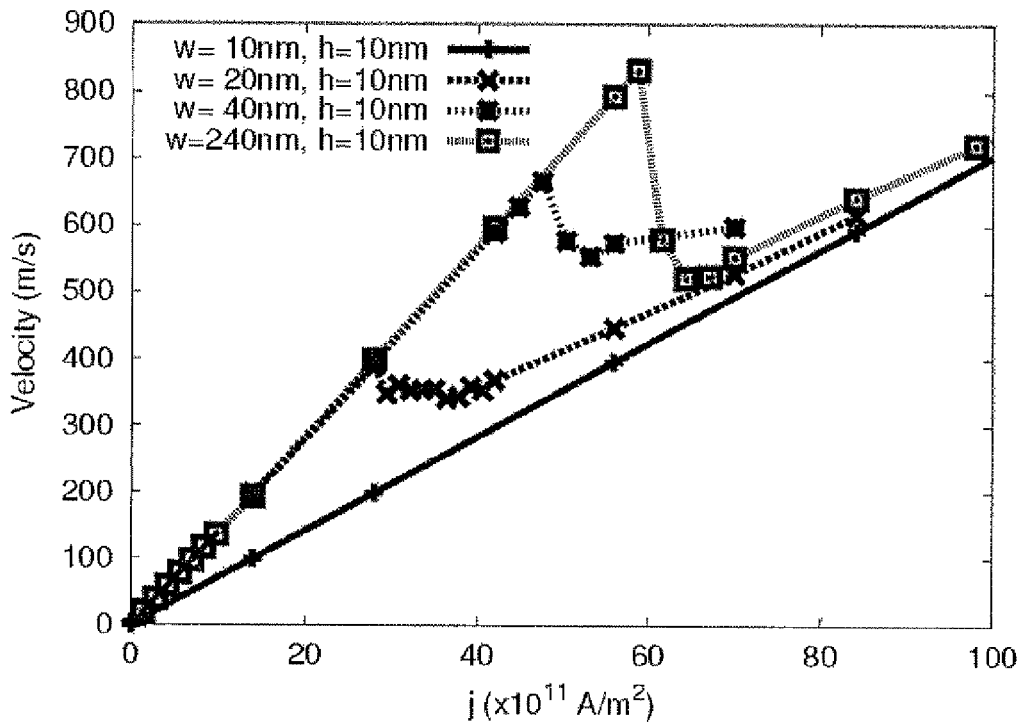
FIG. 9 is a graph showing a relationship between the density of the current supplied to a ferromagnetic thin wire and the moving velocity of a domain wall.
Figure 10:
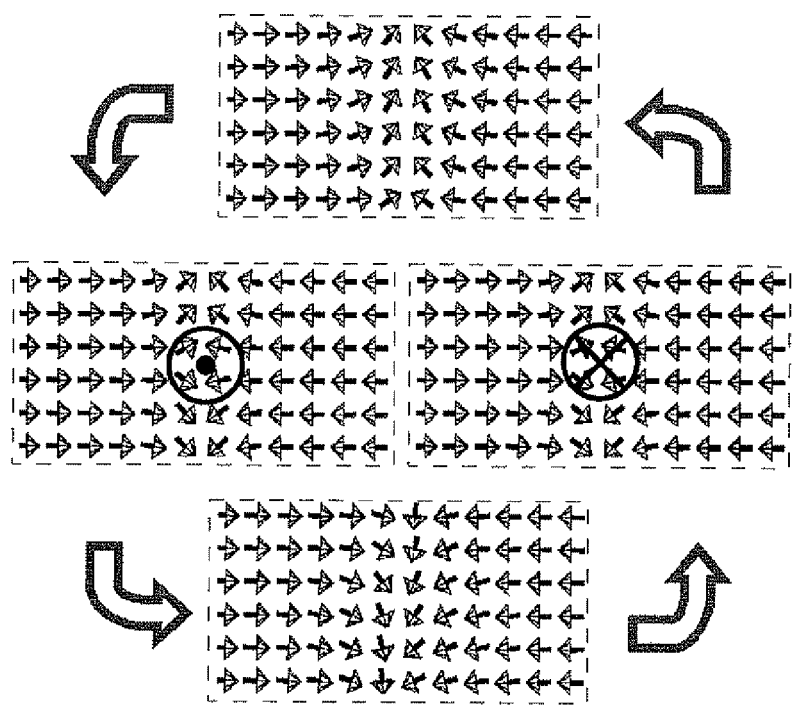
FIG. 10 is a diagram illustrating how a magnetic moment in a domain wall rotates.

For writing information, i.e. for inverting the direction of the magnetic moment, it is preferable to supply a pulsed direct current to the ferromagnetic thin wire along the longitudinal axis thereof by the pulsed current supplier. FIG. 8 shows the result of a calculation of the direction of the magnetic moment in the domain wall in the case where a pulsed direct current having a current density of $7.5 \times 10^{11}$ A/m$^2$ and pulse duration of 0.1 ns is supplied to a ferromagnetic thin wire having a cross section measuring 4.5 nm wide and 4 nm high. In the graph shown in FIG. 8, the positive/negative sign of the vertical axis values represents the direction of the magnetic moment. This graph demonstrates that the direction of the magnetic moment was inverted approximately 0.5 ns after a pulsed current was supplied. Although a slight oscillation was observed in the subsequent phase, it can be confirmed that the direction of the magnetic moment was inverted within the domain wall.

It is evident that the microwave oscillator and magnetic memory that have been described thus far in detail are mere examples of the ferromagnetic thin wire element according to the present invention. It is naturally possible to appropriately make any improvements or modifications within the spirit of the present invention.

The invention claimed is:

1. A ferromagnetic thin wire element utilizing a direction of a magnetic moment of a domain wall within a ferromagnetic thin wire, comprising:
   a) a ferromagnetic thin wire having a domain wall inside, with a magnetic moment at a center of the domain wall being perpendicular to a longitudinal axis of the thin wire;
   b) a current supplier for supplying a direct current to the ferromagnetic thin wire along the longitudinal axis thereof;
   c) a domain wall fixation means for fixing the domain wall so as to prevent the domain wall from moving in the ferromagnetic thin wire when the direct current is supplied from the current supplier; and
   d) a magnetization reader for reading the direction of the magnetic moment in the domain wall.

2. The ferromagnetic thin wire element according to claim 1, wherein the domain wall fixation means includes two ferromagnets provided at both ends in an axial direction of the ferromagnetic thin wire, each ferromagnet having a magnetic moment directed parallel to the axial direction of the ferromagnetic thin wire and opposite to the magnetic moment of the other ferromagnet.

3. The ferromagnetic thin wire element according to claim 1, wherein the domain wall fixation means includes antiferromagnets provided on both sides of the domain wall along an axial direction of the ferromagnetic thin wire so that the magnetic moments on both sides of the domain wall are oriented in different directions from each other.

4. The ferromagnetic thin wire element according to claim 1, wherein the magnetization reader is a TMR element including a region where the domain wall of the ferromagnetic thin wire is present.

5. A microwave oscillator utilizing a magnetic moment of a domain wall within a ferromagnetic thin wire, comprising:
   a ferromagnetic thin wire having a domain wall inside, with a magnetic moment at a center of the domain wall being perpendicular to a longitudinal axis of the thin wire;
   a current supplier for supplying a direct current to the ferromagnetic thin wire along the longitudinal axis thereof;
   a domain wall fixation means for fixing the domain wall so as to prevent the domain wall from moving in the ferromagnetic thin wire when the direct current is supplied from the current supplier; and
   a rotation detector for detecting a rotation of the magnetic moment in the domain wall.

6. The microwave oscillator according to claim 5, wherein a height-to-width ratio of a cross section of the ferromagnetic thin wire is 1:1.1 or less, and a width of the same cross-section is 20 nm or smaller.

7. The microwave oscillator according to claim 5, wherein the domain wall fixation means includes two ferromagnets provided at both ends in an axial direction of the ferromagnetic thin wire, each ferromagnet having a magnetic moment directed parallel to the axial direction of the ferromagnetic thin wire and opposite to the magnetic moment of the other ferromagnet.

8. The microwave oscillator according to claim 5, wherein the domain wall fixation means includes antiferromagnets provided on both sides of the domain wall along an axial direction of the ferromagnetic thin wire so that the magnetic moments on both sides of the domain wall are oriented in different directions from each other.

9. The microwave oscillator according to claim 5, wherein the rotation detector is a TMR element including a region where the domain wall of the ferromagnetic thin wire is present.

10. The microwave oscillator according to claim 5, wherein the ferromagnetic thin wire is made of permalloy.

11. A microwave generation method using a ferromagnetic thin wire having a domain wall inside, with a magnetic moment at a center of the domain wall being perpendicular to a longitudinal axis of the thin wire, comprising the steps of rotating the magnetic moment around the longitudinal axis in the domain wall by supplying a direct current while fixing the domain wall so as to prevent the domain wall from moving in the ferromagnetic thin wire; and extracting microwaves due to the rotation of the magnetic moment.

12. A magnetic memory, comprising:
   a ferromagnetic thin wire having a domain wall inside, with a magnetic moment at a center of magnetization thereof being stable in one of two directions of the cross-sectional width direction;
   a pulsed current supplier for inverting a direction of the magnetic moment by supplying a pulsed direct current to the ferromagnetic thin wire along a longitudinal axis thereof;
   a domain wall fixation means for fixing the domain wall so as to prevent the domain wall from moving in the ferromagnetic thin wire when the pulsed direct current is supplied from the current supplier; and
   a magnetization direction detector for detecting a direction of the magnetic moment in the domain wall.

13. The magnetic memory according to claim 12, wherein the height-to-width ratio of the cross section of the ferromagnetic thin wire is within a range from 1:1.1 to 1:1.2.

14. The magnetic memory according to claim 12, wherein the domain wall fixation means includes two ferromagnets provided at both ends in an axial direction of the ferromagnetic thin wire, each ferromagnet having a magnetic moment directed parallel to the axial direction of the ferromagnetic thin wire and opposite to the magnetic moment of the other ferromagnet.

15. The magnetic memory according to claim 12, wherein the domain wall fixation means includes antiferromagnets provided on both sides of the domain wall along an axial direction of the ferromagnetic thin wire so that the magnetic moments on both sides of the domain wall are oriented in different directions from each other.

16. The magnetic memory according to claim 12, wherein the rotation detector is a TMR element including a region where the domain wall of the ferromagnetic thin wire is present.

17. The magnetic memory according to claim 12, wherein the ferromagnetic thin wire is made of permalloy.

18. A method for writing information into a magnetic memory capable of representing binary information by a direction of a magnetic moment located at a center of a domain wall within a ferromagnetic thin wire, the magnetic moment being stable in one of two directions of the cross-sectional width direction, the magnetic memory further including a domain wall fixation means for fixing the domain wall so as to prevent the domain wall from moving in the ferromagnetic thin wire when a pulsed direct current is supplied, and the method comprising inverting the direction of the magnetic moment by supplying a pulsed direct current to the ferromagnetic thin wire along a longitudinal axis thereof.

* * * * *